(12) United States Patent
Yoda

(10) Patent No.: US 9,570,641 B2
(45) Date of Patent: Feb. 14, 2017

(54) POLYMER AND SOLAR CELL ENCAPSULANT USING THE POLYMER

(71) Applicant: Sumitomo Chemical Company, Limited, Tokyo (JP)

(72) Inventor: Hiroaki Yoda, Chiba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 14/356,621

(22) PCT Filed: Nov. 14, 2012

(86) PCT No.: PCT/JP2012/080112
§ 371 (c)(1),
(2) Date: May 7, 2014

(87) PCT Pub. No.: WO2013/073708
PCT Pub. Date: May 23, 2013

(65) Prior Publication Data
US 2014/0316093 A1  Oct. 23, 2014

(30) Foreign Application Priority Data
Nov. 16, 2011 (JP) .................................. 2011-250408

(51) Int. Cl.
| | |
|---|---|
| *H01L 31/048* | (2014.01) |
| *C08G 61/08* | (2006.01) |
| *C09D 123/08* | (2006.01) |
| *C08K 5/5425* | (2006.01) |

(52) U.S. Cl.
CPC ........... *H01L 31/0481* (2013.01); *C08G 61/08* (2013.01); *C09D 123/0853* (2013.01); *C09D 123/0869* (2013.01); *C08G 2261/135* (2013.01); *C08G 2261/1426* (2013.01); *C08G 2261/3322* (2013.01); *C08G 2261/418* (2013.01); *C08G 2261/724* (2013.01); *C08G 2261/76* (2013.01); *C08G 2261/91* (2013.01); *C08K 5/5425* (2013.01); *C08L 2203/204* (2013.01); *C08L 2312/00* (2013.01); *Y02E 10/50* (2013.01)

(58) Field of Classification Search
CPC .................. H01L 31/0481; C08G 2261/3322; C08G 2261/418; C08G 61/08; Y02E 10/50
USPC ....................................................... 526/309
See application file for complete search history.

(56) References Cited

U.S. PATENT DOCUMENTS

| | | | | |
|---|---|---|---|---|
| 6,093,757 A * | 7/2000 | Pern | ................ | 524/99 |
| 6,203,923 B1 | 3/2001 | Bansleben et al. | | |
| 7,504,465 B2 | 3/2009 | Baugh et al. | | |
| 2003/0236367 A1 | 12/2003 | Choi et al. | | |
| 2005/0137369 A1* | 6/2005 | Baugh et al. | ................ | 526/171 |
| 2006/0149009 A1 | 7/2006 | Arimoto et al. | | |
| 2008/0132708 A1 | 6/2008 | Grubbs et al. | | |
| 2009/0169902 A1 | 7/2009 | Inubushi et al. | | |
| 2011/0061735 A1 | 3/2011 | Nishijima | | |

FOREIGN PATENT DOCUMENTS

| | | | |
|---|---|---|---|
| JP | H05-331265 A | 12/1993 | |
| JP | 2000-183385 A | 6/2000 | |
| WO | 2010067040 A1 | 6/2010 | |

OTHER PUBLICATIONS

Lehman Jr. et al, "Linear Copolymers of Ehylene and Polar Vinyl Monomers via Olefin Metathesis-Hydrogenation: Synthesis, Characterization, and Comparison to Branched Analogues," Macromolecules, vol. 40, No. 8, pp. 2643-2656 (2007).

Demonceau et al, "Novel Ruthenium-Based Catalyst Systems for the Ring-Opening Metathesis Polymerization of Low-Strain Cyclic Olefins," Macromolecules, vol. 30, No. 11, pp. 3127-3136 (Jun. 2, 1997).

Int'l Search Report issued Mar. 5, 2013 in Int'l Application No. PCT/JP2012/080112.

Extended Search Report issued Jul. 23, 2015 in EP App No. 12848898.8.

* cited by examiner

*Primary Examiner* — Ling Choi
*Assistant Examiner* — Chun-Cheng Wang
(74) *Attorney, Agent, or Firm* — Panitch Schwarze Belisario & Nadel LLP

(57) ABSTRACT

Provided is a polymer from which an encapsulant excellent in weather resistance and processability can be obtained when being used for an encapsulant for a solar cell. The polymer that has a main chain comprising repeating units represented by formula (1) and repeating units represented by formula (2) and satisfies requirements (a1), (a2), and (a3),

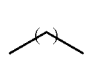 (1)

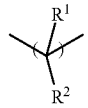

(2)

(a1): the ratio of the number of the repeating units represented by formula (2) to the total number of the carbon atoms that constitute the main chain of the polymer is from 3.8% to 7.5%;

(a2): the ratio X represented by formula (3) is from 82% to 100%;

$X = 100 \times A/B$  (3)

(a3): the polymer has a melting point of 42° C. to 90° C. as measured with a differential scanning calorimeter.

7 Claims, No Drawings

POLYMER AND SOLAR CELL ENCAPSULANT USING THE POLYMER

CROSS-REFERENCE TO RELATED APPLICATION

This application is a Section 371 of International Application No. PCT/JP2012/080112, filed Nov. 14, 2012, which was published in the Japanese language on May 23, 2013, under International Publication No. WO 2013/073708 A1, and the disclosure of which is incorporated herein by reference.

TECHNICAL FIELD

The present invention relates to a polymer and a solar cell encapsulant using the polymer.

BACKGROUND ART

In a solar cell, in order to prevent functional deterioration of a semiconductor that performs photoelectric conversion, the semiconductor has been encapsulated on a protective substrate via an encapsulant. As such an encapsulant for a solar cell, an ethylene-vinyl acetate copolymer (EVA) is used nowadays as disclosed in JP-A-2000-183385.

DISCLOSURE OF THE INVENTION

Solar cell encapsulants are required to be excellent in weather resistance because use over a long period of time is assumed. The ethylene-vinyl acetate copolymer that has heretofore been used for a solar cell encapsulant is obtained usually by radically polymerizing ethylene with vinyl acetate under high-temperature and high-pressure conditions. An ethylene-vinyl acetate copolymer prepared by this method has a structure that has many branches or two or more continuous repeating units derived from vinyl acetate. Ethylene-vinyl acetate copolymers with such a structure have room to be improved in weather resistance.

The present invention has been devised in view of the above-described problems, and an object thereof is to provide a polymer suitable for a material of an encapsulant improved in weather resistance and a solar cell encapsulant using the polymer.

That is, the present invention relates to a polymer that has a main chain comprising repeating units represented by formula (1) and repeating units represented by formula (2) and satisfies requirements (a1), (a2), and (a3),

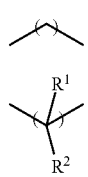

(1)

(2)

wherein $R^1$ represents hydrogen, a methyl group, or an ethyl group, and $R^2$ represents an acetoxy group, a methoxycarbonyl group, an ethoxycarbonyl group, or a tert-butoxycarbonyl group, (a1): the ratio of the number of the repeating units represented by formula (2) to the total number of the carbon atoms that constitute the polymer main chain is from 3.8% to 7.5%;

(a2): the ratio X represented by formula (3) is from 82% to 100%;

$$X = 100 \times A/B \quad (3)$$

wherein A represents the total number of the carbon atoms of the carbonyl groups of the $R^2$s of all the repeating units that satisfy the following requirement (a2-1) and are represented by formula (2), (a2-1): no functional group selected from among the following formulae (A), (B), (C), (D), (5) and (F) is bonded to any of the carbon atoms $C^1$, $C^2$, and $C^3$, where $C^1$ is a carbon atom that bonds to a repeating unit represented by formula (2), $C^2$ is a carbon atom that bonds to $C^1$, and $C^3$ that bonds to $C^2$, and B is the total number of the carbon atoms of the carbonyl groups of the $R^2$s of all the repeating units represented by formula (2),

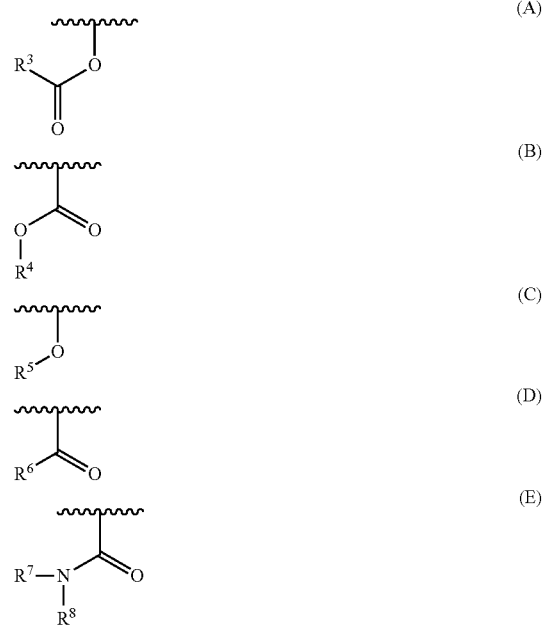

wherein $R^3$, $R^4$, $R^5$, $R^6$, $R^7$, and $R^8$ each independently represent an alkyl group or hydrogen;

(a3): the polymer has a melting point of 42° C. to 90° C. as measured with a differential scanning calorimeter.

MODE FOR CARRYING OUT THE INVENTION

Embodiments of the present invention are described in detail below.

[Polymer]

(Basic Structure)

The polymer according to the present invention is a polymer whose main chain comprises repeating units represented by formula (1) and repeating units represented by formula (2),

(1)

(2)

wherein $R^1$ represents hydrogen, a methyl group, or an ethyl group, and $R^2$ represents an acetoxy group, a methoxycarbonyl group, an ethoxycarbonyl group, or a tert-butoxycarbonyl group.

The polymer according to the present invention satisfies the following requirements (a1), (a2), and (a3).

(a1): The ratio of the number of the repeating units represented by formula (2) to the total number of the carbon atoms that constitute the polymer main chain is from 3.8% to 7.5%.

(a2): The ratio X represented by formula (3) is from 82% to 100%, $$X=100\times A/B \qquad (3)$$

wherein A represents the total number of the carbon atoms of the carbonyl groups of the $R^2$s of all the repeating units that satisfy the following requirement (a2-1) and are represented by formula (2), (a2-1): no functional group represented by the following formula (A), (B), (C), (D), (E) or (F) is bonded to any of the carbon atoms $C^1$, $C^2$, and $C^3$, where $C^1$ is a carbon atom that bonds to a repeating unit represented by formula (2), $C^2$ is a carbon atom that bonds to $C^1$, and $C^3$ that bonds to $C^2$, and B is the total number of the carbon atoms of the carbonyl groups of the $R^2$s of all the repeating units represented by formula (2),

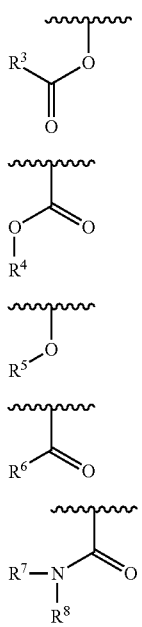

wherein $R^3$, $R^4$, $R^5$, $R^6$, $R^7$, and $R^8$ each independently represent an alkyl group or hydrogen.

(a3): The polymer has a melting point of 42° C. to 90° C. as measured with a differential scanning calorimeter.

(Requirement (a1))

In the polymer according to the present invention, the ratio of the number of the repeating units represented by formula (2) to the total number of the carbon atoms that constitute the polymer main chain is from 3.8% to 7.5%. In order to obtain a more transparent, more flexible encapsulant, the ratio is preferably 4.0 mol % or more. In the case of producing an encapsulant by melt-processing the polymer, the ratio is preferably 6.7 mol % or less in order to make the polymer easier to process.

The ratio is calculated from the following formula (5) when $R^1$ in formula (2) is hydrogen.

$$Y=100\times 2\alpha/(2\alpha+\beta) \qquad (5)$$

In formula (5), Y is the ratio of the number of the repeating units represented by formula (2) to the total number of the carbon atoms constituting the polymer main chain, $\alpha$ is the area of a peak derived from the hydrogen that is $R^1$ of formula (2) in the $^1$H-NMR spectrum of the polymer, and $\beta$ is the area of a peak derived from the hydrogen contained in formula (1) in the $^1$H-NMR spectrum of the polymer.

The peak derived from the hydrogen contained in formula (1) and the peak derived from the hydrogen contained in $R^2$ of formula (2) may be observed at almost the same chemical shift. In such a case, it is necessary to subtract the value equivalent to the area of the peak derived from the hydrogen contained in $R^2$ of formula (2) from the denominator of formula (5). In that case, the ratio of the number of the repeating units represented by formula (2) to the total number of the carbon atoms constituting the polymer main chain is calculated from the following formula (6).

$$Y=100\times 2\alpha/(2\alpha+\beta-\gamma\times\alpha) \qquad (6)$$

In formula (6), $\gamma$ is the number of the hydrogen contained in $R^2$ of formula (2). In this case, $\beta$ is a value that is equivalent to the sum total of the area of the peak derived from the hydrogen contained in formula (1) and the area of the peak derived from the hydrogen contained in $R^2$ of formula (2).

As described below, the polymer may contain repeating units represented by formula (1), repeating units represented by formula (2), and repeating units represented by formula (4) in its main chain. When the polymer contains repeating units represented by formula (1), repeating units represented by formula (2), and repeating units represented by formula (4) in its main chain and $R^1$ of formula (2) is hydrogen, the ratio of the number of the repeating units represented by formula (2) to the total number of the carbon atoms constituting the polymer main chain is calculated by the following formula (7).

$$Y=100\times 2\alpha/(2\alpha+\beta+2\delta) \qquad (7)$$

In formula (7), $\delta$ is the area of a peak derived from hydrogen contained in formula (4).

Also in this case, when a peak derived from hydrogen contained in formula (1) and a peak derived from hydrogen contained in $R^2$ of formula (2) are observed at almost the same chemical shift, it is necessary to perform the same calculation as the above formula (6). In this case, the ratio of the number of the repeating units represented by formula (2) to the total number of the carbon atoms constituting the polymer main chain is calculated from the following formula (8).

$$Y=100\times 2\alpha/(2\alpha+\beta-\gamma\times\alpha+2\delta) \qquad (8)$$

When the ratio of the number of the repeating units represented by formula (2) to the total number of the carbon atoms constituting the polymer main chain is calculated by using the above formulae (5) to (8), a $^1$H-NMR spectrum of a solution is used in which the polymer has been dissolved in ortho-dichlorobenzene. The $^1$H-NMR spectrum is measured using a nuclear magnetic resonance apparatus.

In the case of being a repeating unit represented by formula (2) wherein $R^1$ is hydrogen and $R^2$ is an acetoxy group, when the ratio of the number of the repeating units represented by formula (2) to the total number of the carbon atoms constituting the polymer main chain is calculated, the peak derived from the hydrogen that is $R^1$ of formula (2) is observed near 4.9 ppm and the peak derived from the hydrogen contained in formula (1) is observed near 0.7 to 2.5 ppm in the above formula (6). The number γ of the hydrogen contained in $R^2$ of formula (2) is 3.

In the above formula (8), the peak derived from the hydrogen contained in formula (4) is observed near 5.5 ppm.

When $R^1$ of formula (2) is a methyl group or an ethyl group, the ratio of the number of the repeating units represented by formula (2) to the total number of the carbon atoms constituting the polymer main chain is calculated from the following formula (9).

$$Y=100\times C/\{D-(E-1)\times C\} \quad (9)$$

In formula (9), Y is the ratio of the number of the repeating units represented by formula (2) to the total number of the carbon atoms constituting the main chain of the polymer, C is the area of a peak derived from the carbon atom of the carbonyl group of $R^2$ of formula (2) observed at between 168 ppm to about 180 ppm in a $^{13}$C-NMR spectrum of the polymer, D is the sum total of the areas of all the peaks different from the peak derived from the solvent 1,1,2,2-tetrachloroethane d2 (the peak observed at 74.2 ppm) in a $^{13}$C-NMR spectrum of the polymer, and
E is the number of the carbon atoms contained in formula (2).

When the ratio of the number of the repeating units represented by formula (2) to the total number of the carbon atoms constituting the polymer main chain is calculated by using the above formula (9), a $^{13}$C-NMR spectrum of a solution is used in which the polymer has been dissolved in 1,1,2,2-tetrachloroethane d2. The $^{13}$C-NMR spectrum is measured using a nuclear magnetic resonance apparatus (600-MHz nuclear magnetic resonance apparatus AVANCE600 manufactured by Bruker).

(Requirement (a2))

In the polymer according to the present invention, the ratio X represented by formula (3) is from 82% to 100%;

$$X=100\times A/B \quad (3)$$

wherein A represents the total number of the carbon atoms of the carbonyl groups of the $R^2$s of all the repeating units that satisfy the following requirement (a2-1) and are represented by formula (2), (a2-1): no functional group represented by the following formula (A), (B), (C), (D), (E) or (F) is bonded to any of the carbon atoms $C^1$, $C^2$, and $C^3$, where $C^1$ is a carbon atom that bonds to a repeating unit represented by formula (2), $C^2$ is a carbon atom that bonds to $C^1$, and $C^3$ that bonds to $C^2$, and
B is the total number of the carbon atoms of the carbonyl groups of the $R^2$s of all the repeating units represented by formula (2),

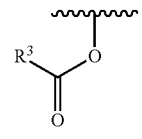

(A)

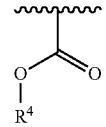

(B)

(C)

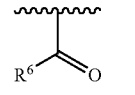

(D)

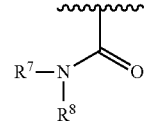

(E)

wherein $R^3$, $R^4$, $R^5$, $R^6$, $R^7$, and $R^8$ each independently represent an alkyl group or hydrogen.

X is the ratio of the number of repeating units which are represented by formula (2) and in the vicinity of which no polar groups are present to the number of all repeating units represented by formula (2).

Examples of the alkyl group as $R^3$, $R^4$, $R^5$, $R^6$, $R^7$, or $R^8$ include alkyl groups having 1 to 20 carbon atoms.

When the polymer contains repeating units represented by formula (1), repeating units represented by formula (2), and repeating units represented by formula (4) in its main chain, the above-described A, B and X are calculated from a $^{13}$C-NMR spectrum of a polymer prepared by hydrogenating all carbon-carbon double bonds in the main chain of a polymer derived from formula (4), thereby making all carbon-carbon bonds in the main chain be saturated bonds.

The ratio X represented by formula (3) is from 82% to 100%, preferably 83% or more, more preferably 85% or more, even more preferably 87% or more, particularly preferably 90% or more, most preferably 95% or more.

When not only $R^1$ of formula (2) is hydrogen and $R^2$ is an acetoxy group but also a functional group represented by the following formula (A), (B), (C), (D), (E) or (F) is bonded to any of the carbon atoms $C^1$, $C^2$, and $C^3$, the peak derived from the carbon atoms of the carbonyl groups of $R^2$ of the repeating units represented by formula (2) is observed at 170.2 ppm. When not only $R^1$ of formula (2) is hydrogen and $R^2$ is an acetoxy group but also no functional group represented by the following formula (A), (B), (C), (D), (E) or (F) is bonded to any of the carbon atoms $C^1$, $C^2$, and $C^3$, the peak derived from the carbon atoms of the carbonyl groups of $R^2$ of the repeating units represented by formula (2) is observed at 170.4 ppm. It is noted that the above chemical shift values are values taken when that of the peak derived from 1,1,2,2-tetrachloroethane d2 is taken as 74.2 ppm.

The ratio X in the case that $R^2$ of formula (2) is a methoxycarbonyl group, an ethoxycarbonyl group, or a tert-butoxycarbonyl group can also be calculated similarly.

(Requirement (a3): Melting Point of Polymer)

The polymer according to the present invention has a melting point of 42° C. to 90° C. as measured with a differential scanning calorimeter. From the viewpoint that in melt-extrusion processing a polymer and a crosslinking agent to produce a solar cell encapsulant, a crosslinking reaction hardly proceeds during the processing and the melt-extrusion processing is done easily, the melting point of the polymer is preferably 80° C. or lower, more preferably 70° C. or lower.

The polymer is usually used as a pellet produced by processing the polymer and an arbitrary additive together. The melting point is preferably 50° C. or higher, more preferably 57° C. or higher, even more preferably 59° C. or higher because such a melting point allows pellets containing the polymer to be inhibited from fusing together. The melting point is the temperature at the top of the melting peak that is greatest in peak height among the melting peaks of a melting curve measured with a differential scanning calorimeter. The melting point is determined specifically by the following method. About 10 mg of sample is sealed in an aluminum pan, and then the pan with the sample sealed therein is (1) held at 150° C. for 5 minutes, (2) cooled from 150° C. to 0° C. at a rate of 5° C./minute, (3) held at 0° C. for 2 minutes, (4) heated from 0° C. to 150° C. at a rate of 5° C./minute by using a differential scanning calorimeter, and a melting curve produced during (4) is measured. In the melting curve produced during (4), the temperature at the top of the melting peak greatest in peak height among the melting peaks observed between 5° C. and the melting completion temperature (that is, the temperature at which the melting curve returns to its base line on the higher temperature side) is taken as a melting point.

(Repeating Unit (4))

The polymer according to the present invention may be a polymer containing repeating units represented by formula (1), repeating units represented by formula (2), and repeating units represented by the following formula (4) in its main chain. In this case, the ratio of the number of the carbon atoms of formula (4) to the total number of the carbon atoms constituting the polymer main chain is preferably 13% or less.

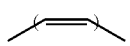

(4)

The ratio of the number of the carbon atoms of formula (4) to the total number of the carbon atoms constituting the polymer main chain is calculated by the following formula (10).

$$Z=100\times F/\{D-(E-1)\times C\}$$ (10)

In formula (10), Z is the ratio of the number of the carbon atoms of formula (4) to the total number of the carbon atoms constituting the polymer main chain, C is the area of a peak derived from the carbon atom of the carbonyl group of $R^2$ of formula (2) observed at between 168 ppm to about 180 ppm in a $^{13}$C-NMR spectrum of the polymer, D is the sum total of the areas of all the peaks different from the peak derived from 1,1,2,2-tetrachloroethane d2 (the peak observed at 74.2 ppm) in a $^{13}$C-NMR spectrum of the polymer, E is the number of the carbon atoms contained in formula (2), and F is the area of a peak derived from the carbon atom of formula (4) observed at between 120 ppm to about 140 ppm in a $^{13}$C-NMR spectrum of the polymer.

(Molecular Weight and Molecular Weight Distribution of Polymer)

From the viewpoint that a pellet containing a polymer is excellent in processability, the number average molecular weight of the polymer according to the present invention is usually 10,000 or more, preferably 15,000 or more, more preferably 21,000 or more. From the viewpoint that in mixing a polymer with a crosslinking agent, followed by melt-processing, the melt-processing is done easily at a temperature lower than the temperature at which the crosslinking agent decomposes, the number average molecular weight of the polymer is preferably 500,000 or less, more preferably 100,000 or less. From the viewpoint of improvement in processability, the molecular weight distribution (Mw/Mn) of the polymer is preferably from 1.1 to 6.0, more preferably from 1.5 to 4. Mw indicates the weight average molecular weight of a polymer, and Mn indicates the number average molecular weight of the polymer.

The weight average molecular weight (Mw) of a polymer is determined by multiplying the polystyrene-equivalent weight average molecular weight as measured by gel permeation chromatography (GPC) by the Q factor ratio of polyethylene to polystyrene (17.7/41.3). The number average molecular weight (Mn) of a polymer is determined by multiplying the polystyrene-equivalent number average molecular weight as measured by gel permeation chromatography (GPC) by the Q factor ratio of polyethylene to polystyrene (17.7/41.3).

Mw/Mn is the value calculated by dividing Mw by Mn. Measurement conditions to be used in GPC include, for example, the following conditions.

(1) Instrument: Waters150C, manufactured by Waters
(2) Separation column: TOSOH TSKgel GMH-HT
(3) Measurement temperature: 140° C.
(4) Carrier: ortho-dichlorobenzene
(5) Flow rate: 1.0 mL/min
(6) Injection amount: 500 μL
(7) Detector: differential refractometer
(8) Molecular weight standard substance: standard polystyrenes (Transparency)

The transparency of the polymer according to the present invention can be evaluated, for example, in terms of the light transmittance of the polymer. The light transmittance of the polymer according to the present invention is preferably 85% or more, more preferably 87% or more. The light transmittance is a value measured using the following method. A polymer is pressed with a pressure of 2 MPa for 5 minutes with a hot presser at 150° C., then cooled for 5 minutes with a cooling presser at 30° C., thereby being shaped into a sheet of about 500 μm in thickness. Using a spectrophotometer (UV-3150, manufactured by Shimadzu Corporation), light transmittance within a wavelength range of 400 nm to 1200 nm is measured in the thickness direction of the sheet, and the average of the measurements is taken as the light transmittance of the polymer.

(Method for Producing Polymer)
<Polymerization Method>

The polymer according to the present invention can be produced by coordination polymerization, radical polymerization, metathesis polymerization, etc.

The polymer according to the present invention can be produced by, for example, a method of ring-opening metathesis copolymerizing an unsubstituted cyclic olefin having 3 or more carbon atoms with a cyclic olefin having 5 or more ring-forming carbon atoms and having a group selected from the group consisting of an acetoxy group, a methoxycarbonyl group, an ethoxycarbonyl group, and a tert-butoxycarbonyl group, a method of metathesis copolymerizing an acyclic diene represented by formula (11) with an unsubstituted acyclic diene having 5 or more carbon atoms, or a method of metathesis polymerizing an acyclic diene represented by formula (11).

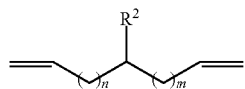

(11)

In formula (11), $R^2$ represents a group selected from the group consisting of an acetoxy group, a methoxycarbonyl group, an ethoxycarbonyl group, and a tert-butoxycarbonyl group; n is 1 or more, m is 1 or more, and (n+m) is from 2 to 22.

Examples of a cyclic olefin having 3 or more carbon atoms capable of being used for metathesis polymerization include monoolefins such as cyclopropene, cyclobutene, cyclopentene, cyclohexene, cycloheptene, cyclooctene, cyclononene, and cyclodecene, cyclodienes such as cyclooctadiene, cyclodecadiene, and dicyclopentadiene, and cyclotrienes such as cyclododecatriene. Cyclooctene is preferred because of its easy availability.

Examples of the cyclic olefin having 5 or more ring-forming carbon atoms and having a group selected from the group consisting of an acetoxy group, a methoxycarbonyl group, an ethoxycarbonyl group, and a tert-butoxycarbonyl group include compounds each resulting from replacing at least one hydrogen of a cyclic olefin having 5 or more carbon atoms by a group selected from the group consisting of an acetoxy group, a methoxycarbonyl group, an ethoxycarbonyl group, and a tert-butoxycarbonyl group.

Examples of a cyclic olefin having an acetoxy group and having 5 or more ring-forming carbon atoms include 4-acetoxy-1-cyclooctene and 5-acetoxy-1-cyclooctene.

Examples of a cyclic olefin having a methoxycarbonyl group and having 5 or more ring-forming carbon atoms include 3-methyl-3-methoxycarbonyl-1-cyclooctene, 4-methyl-4-methoxycarbonyl-1-cyclooctene, 3-methoxycarbonyl-1-cyclooctene, and 4-methoxycarbonyl-1-cyclooctene.

Examples of a cyclic olefin having an ethoxycarbonyl group and having 5 or more ring-forming carbon atoms include 3-methyl-3-ethoxycarbonyl-1-cyclooctene, 4-methyl-4-ethoxycarbonyl-1-cyclooctene, 3-ethoxycarbonyl-1-cyclooctene, and 4-ethoxycarbonyl-1-cyclooctene.

Examples of a cyclic olefin having a tert-butoxycarbonyl group and having 5 or more ring-forming carbon atoms include 3-methyl-3-tert-butoxycarbonyl-1-cyclooctene, 4-methyl-4-tert-butoxycarbonyl-1-cyclooctene, 3-tert-butoxycarbonyl-1-cyclooctene, and 4-tert-butoxycarbonyl-1-cyclooctene.

Preferred for obtaining a polymer having a large number average molecular weight is a method of ring-opening metathesis copolymerizing monomers.

A ruthenium-carbene complex is preferred as a catalyst for metathesis polymerization from the viewpoints of being little in the amount of the catalyst to be used and being little in the amount of the catalyst that is to remain in a polymer. Another (transition metal of Group 4-8 of the periodic table)-carbene complex may be used together with the ruthenium-carbene complex.

Examples of the ruthenium-carbene complex include a ruthenium-carbene complex in which a heteroatom-containing carbene compound is bonded to a neutral electron-donating compound, a ruthenium-carbene complex in which two heteroatom-containing carbene compounds are bonded to each other, and a ruthenium-carbene complex having a coordinative ether bonding in carbene.

Specific examples of the ruthenium-carbene complex in which a heteroatom-containing carbene compound is bonded to a neutral electron-donating compound include benzylidene-bis(tricyclohexylphosphine)dichlororuthenium, benzylidene[1,3-bis(2,4,6-trimethylphenyl)-2-imidazolidinylidene]dichloro(tricyclohexylphosphine)ruthenium, benzylidene(1,3-dimesitylimidazolidin-2-ylidene)(tricyclohexylphosphine)ruthenium dichloride, (1,3-dimesitylimidazolidin-2-ylidene)(3-methyl-2-buten-1-ylidene)(tricyclopentylphosphine)ruthenium dichloride, benzylidene(1,3-dimesityl-octahydrobenzimidazol-2-ylidene) (tricyclohexylphosphine)ruthenium dichloride, benzylidene [1,3-di(1-phenylethyl)-4-imidazolin-2-ylidene] (tricyclohexylphosphine)ruthenium dichloride, benzylidene (1,3-dimesityl-2,3-dihydrobenzimidazol-2-ylidene) (tricyclohexylphosphine)ruthenium dichloride, benzylidene (tricyclohexylphosphine)(1,3,4-triphenyl-2,3,4,5-tetrahydro-1H-1,2,4-triazol-5-ylidene)ruthenium dichloride, (1,3-diisopropylhexahydropyrimidin-2-ylidene)(ethoxymethylene)(tricyclohexylphosphine)ruthenium dichloride, and benzylidene(1,3-dimesitylimidazolidin-2-ylidene)pyridineruthenium dichloride.

Specific examples of the ruthenium-carbene complex in which two heteroatom-containing carbene compounds are bonded to each other include benzylidenebis(1,3-dicyclohexylimidazolidin-2-ylidene)ruthenium dichloride and benzylidenebis(1,3-diisopropyl-4-imidazolin-2-ylidene)ruthenium dichloride.

Specific examples of the ruthenium-carbene complex having a coordinative ether bonding in carbene include (1,3-dimesitylimidazolidin-2-ylidene)(2-isopropoxyphenylvinylidene)ruthenium dichloride and (1,3-dimesitylimidazolidin-2-ylidene)(2-ethoxyphenylvinylidene)ruthenium dichloride.

When a ruthenium-carbene complex is used as a catalyst in a ring-opening metathesis polymerization, the molar ratio of the ruthenium of the ruthenium-carbene complex catalyst to the whole amount of the monomers is preferably ruthenium:(the total of the monomers)=1:100 to 1:2,000,000, more preferably 1:500 to 1:1,000,000, even more preferably 1:1,000 to 1:700,000. Using a ruthenium-carbene complex such that the amount of ruthenium may be 1 or less where the total amount of the monomer is taken as 100 is preferred because this makes it easy to remove the catalyst. Using a ruthenium-carbene complex such that the amount of ruthenium may be 1 or more where the total amount of the monomer is taken as 2,000,000 is preferred because this affords a high yield.

In the performing of the ring-opening metathesis copolymerization, a chain transfer agent can be used. Examples of a chain transfer agent that can be used include internal olefins such as 2-butene, 2-pentene, 2-hexene, 3-hexene, 2-heptene, 3-heptene, 2-octene, 3-octene, and 4-octene.

These may have been substituted with a hydroxy group, an alkoxy group, an acyl group, a carbonyl group, an alkoxycarbonyl group, a halogen atom, or the like. These can be used either individually or in a combination of two or more of them.

The amount of the chain transfer agent to be used may be chosen suitably according to the molecular weight of the desired ring-opening metathesis copolymer. In order to obtain a ring-opening metathesis copolymer having a practical molecular weight, the amount of the chain transfer agent is within the range of cyclic olefin:chain transfer agent=1000:1 to 20:1, preferably 800:1 to 50:1, expressed by the molar ratio of the chain transfer agent to the cyclic olefin.

The ring-opening metathesis copolymerization may be performed, as necessary, using a solvent. Examples of the solvent include hydrocarbons and ethers. Examples of the hydrocarbons include aliphatic hydrocarbons, aromatic hydrocarbons, and halogenated hydrocarbons.

Examples of the aliphatic hydrocarbons include hexane, heptane, octane, nonane, decane, dodecane, cyclohexane, cycloheptane, and cyclooctane.

Examples of the aromatic hydrocarbons include benzene, ortho-dichlorobenzene, toluene, xylene, and mesitylene.

Examples of the halogenated hydrocarbons include methylene chloride, chloroform, and carbon tetrachloride.

Examples of the ethers include diethyl ether, tetrahydrofuran, and 1,4-dioxane.

When the ease of removing of a solvent is taken into consideration, hydrocarbons are preferred, and aliphatic hydrocarbons are more preferred. From the viewpoint of well allowing a reaction to proceed, use of hexane, cyclohexane, heptane, octane, cyclooctane, or the like is preferred.

Usually, the amount of the solvent to be used is preferably 1 to 1000 parts by weight, more preferably 2 to 200 parts by weight, even more preferably 3 to 100 parts by weight where the total amount of the monomers to be used is taken as 1 part by weight.

The temperature at which the ring-opening metathesis copolymerization is carried out, which varies with the kind and the amount of the solvent to be used, is usually within the range of 0° C. to 180° C., more preferably is 10° C. to 150° C. The ring-opening metathesis copolymerization reaction is preferably carried out under an inert gas atmosphere.

When performing the ring-opening metathesis copolymerization, a cyclic olefin, which is a monomer, and a chain transfer agent may be mixed and then introduced into a polymerization reaction apparatus or alternatively a cyclic olefin and a chain transfer agent may be introduced into a polymerization reaction apparatus separately.

There is used, for example, a polymerization reaction apparatus having a stirrer or a tubular type polymerization reaction apparatus as the polymerization reaction apparatus in which the metathesis polymerization reaction is performed.

<Reaction Termination Step>

After the completion of the metathesis polymerization reaction, the reaction is stopped promptly by adding a quenching agent to the polymerization reaction solution. The time to be taken from the coming of the polymerization reaction solution into contact with the quenching agent to the stopping of the reaction is preferably as short as possible in order to suppress the development of an excess reaction and thereby suppress the generation of lower molecular weight bodies, and it is preferably 240 seconds or less, more preferably 120 seconds or less.

Alcohols such as methanol, ethanol, propanol, isopropanol, butanol, isobutanol, amyl alcohol, isoamyl alcohol, hexanol, cyclohexanol, octanol, ethylene glycol, 1,2-propanediol, 1,3-propanediol, 1,2-butanediol, 1,4-butanediol, and glycerol, or water can be used as the quenching agent. These may be used either individually or in combination. Taking into consideration that a polymerization catalyst is deactivated by the quenching agent and that components which are undesirable to remain in a polymer such as a polymerization catalyst are separated from a polymerization reaction solution, it is preferred to use water, methanol, ethanol, or a mixed solution thereof.

The amount of the quenching agent to be used is preferably 0.01 to 200 parts by weight per 100 parts by weight of the polymerization reaction solution, and in view of reaction stopping efficiency, operativity and separability, the amount is more preferably 1 part by weight to 100 parts by weight, even more preferably 2 parts by weight to 50 parts by weight.

Preferably, the amounts of the polymerization reaction solution and the quenching agent are adjusted so that a polymerization reaction solution phase and a quenching agent phase may separate from each other, and then a ruthenium-carbene complex is extracted into the stopping agent phase. When liquid-liquid phase separating the polymerization reaction solution from the quenching agent and then extracting the catalyst, it is preferred, in order to enhance the extraction effect, to stir a mixture of the polymerization reaction solution and the quenching agent and then separate the polymerization reaction solution phase from the quenching agent phase by such a technique as liquid separation.

Since the viscosity of the polymerization reaction solution varies and accordingly the diffusibility of the quenching agent in the polymerization reaction solution varies depending upon the polymer concentration in the polymerization reaction solution and the molecular weight of the polymer, the temperature at which the polymerization reaction is stopped is appropriately chosen according to these factors. Usually, the temperature at which the polymerization reaction is stopped is preferably 10 to 100° C., and in view of, for example, the boiling points of the solvent and the quenching agent to be used, it is more preferably 20° C. to 80° C.

<Precipitation Step>

Examples of the method for precipitating the polymer from the polymerization reaction solution include:

a method of removing the solvent from the polymerization reaction solution by such a method as single evaporation, and then removing the residual solvent by film evaporation or the like;

a method of forming the polymer while removing the residual solvent by introducing the polymerization reaction solution into an extruder;

a method of adding a poor solvent to the polymerization reaction solution to precipitate the polymer; and a method of cooling, after stopping the reaction, the polymerization reaction solution to precipitate the polymer.

When the polymerization reaction solution and the quenching agent are separated from each other into liquid phases, preferred is a method of removing the quenching agent by such a technique as liquid separation and then cooling the separated polymerization reaction solution to precipitate the polymer. In order to prevent a phosphorus compound, which serves as a complex ligand, from precipitating together with the polymer, the solid concentration of the polymerization reaction solution to be used for precipitating the polymer is usually preferred to be 20% or less.

Although the temperature at which the polymer is precipitated varies depending upon the molecular weight of the polymer, the temperature is usually 20° C. or lower, preferably 10° C. or lower in order to attain a higher polymer recovery ratio. In order to attain a higher polymer recovery ratio, the difference between the temperature for the reaction stopping step and the temperature for the precipitation step is preferably 10° C. or higher, more preferably 20° C. or higher.

Although the temperature at which the solvent is removed is appropriately adjusted so that the viscosity of the polymerization reaction solution may fall within such a range that a proper operation can be carried out because that viscosity varies depending upon the molecular weight of the polymer formed in the polymerization step, the temperature is usually 40° C. or higher, preferably 60° C. or higher. In consideration of the thermal stability of the polymer, the temperature is preferably 200° C. or lower, more preferably 160° C. or lower.

<Drying>

A dried polymer can be obtained by removing the solvent completely by such a common technique as vacuum drying and hot air drying from a polymer from which the solvent has mostly been removed by any of the above methods.

<Hydrogenation Step>

The polymer produced via metathesis polymerization is a polymer whose main chain comprises repeating units represented by formula (4). In order to adjust the number of repeating units represented by formula (4) relative to the total number of the carbon atoms constituting the polymer main chain, it is preferred to hydrogenate carbon-carbon unsaturated bonds of the main chain.

The hydrogenation of the polymer can be performed using a common hydrogenation catalyst and hydrogen. Examples of the hydrogenation catalyst include Wilkinson's catalysts, Raney nickel catalysts, palladium/carbon, platinum/carbonate, and ruthenium-alkylidene complexes. Usually, hydrogen is added to a solution in which the polymer has been dissolved in a solvent of the same kind as the solvent used for the polymerization preferably so that the hydrogen pressure may be 300 psi or more, more preferably 600 to 5000 psi or more. The hydrogenation is performed usually for 2 to 8 hours, preferably for 3 to 7 hours.

Another possible method for performing hydrogenation of the polymer is a method of dissolving the polymer and p-toluenesulfonyl hydrazide in a solvent of the same kind as the solvent used for the polymerization and allowing them to react at a temperature of 110 to 150° C. for 2 to 8 hours.

(Additives)

Additives such as silane coupling agents, crosslinking agents, auxiliary crosslinking agents, coloring agents, UV absorbers, antioxidants, and discoloration inhibitors may, as necessary, be added to the polymer according to the present invention. Such additives may, for example, be added to a polymer after the polymer is produced via the above-described polymerization reaction.

A solar cell encapsulant obtained using the polymer to which a silane coupling agent has been added is excellent in adhesive force to a light-receiving surface protective material, a lower protective material, and a solar cell element which constitute a solar cell module. Examples of the silane coupling agent include γ-chloropropyltrimethoxysilane, vinyltrichlorosilane, vinyltriethoxysilane, vinyl-tris(β-methoxyethoxy)silane, γ-methacryloxypropyltrimethoxysilane, β-(3,4-ethoxycyclohexyl)ethyl-trimethoxysilane, γ-glycidoxypropyltrimethoxysilane, vinyltriacetoxysilane, γ-mercaptopropyltrimethoxysilane, γ-aminopropyltrimethoxysilane, and N-β-(aminoethyl)-γ-aminopropyltrimethoxysilane.

The loading of the silane coupling agent is, for example, usually 5 parts by mass or less, preferably 0.8 parts by mass or less per 100 parts by mass of the polymer according to the present invention. In order to obtain an encapsulant having more stable adhesive force and high volume resistivity, the addition proportion of the silane coupling agent per 100 parts by mass of the polymer according to the present invention is more preferably 0.01 parts by mass to 0.6 parts by mass.

In order to make the solar cell encapsulant comprising the polymer according to the present invention more unlikely to transform even at elevated temperatures, preferred is an encapsulant having a crosslinked structure within the polymer or between the polymers. Adding a crosslinking agent, e.g., an organic peroxide, to the polymer according to the present invention beforehand and then thermally decomposing the agent to generate radicals can make the polymer have such a crosslinked structure. A gel fraction is used as an index that indicates the degree of crosslinking. The gel fraction is preferably 40% by mass or more where the mass of the polymer is taken as 100% by mass. It can be said that the higher the gel fraction is, the higher thermal resistance stability is. That thermal resistance stability is high means that distortion is less likely to occur even at elevated temperatures.

Any organic peroxide capable of generating a radical at temperatures higher than the melting point of the polymer according to the present invention can be used as the above-mentioned organic peroxide. It is preferable to use such an organic peroxide that the decomposition of the organic peroxide is unlikely to proceed during the production of a sheet-like solar cell encapsulant by extruding the polymer according to the present invention and the crosslinking agent, and the organic peroxide decomposes on heating during the fabrication of a below-described solar cell module to allow the crosslinking of the polymers according to the present invention to be performed. For example, an organic peroxide whose one-hour half-life temperature is 100° C. to 135° C. is preferred. An organic peroxide whose 10-hour half-life temperature is 70° C. or higher is preferred because the crosslinking agent is unlikely to decompose during the extrusion. Examples of preferable organic peroxides include tert-butylperoxy-2-ethylhexyl carbonate, 2,5-dimethylhexane-2,5-dihydroperoxide, 2,5-dimethyl-2,5-di(tert-butylperoxy)hexane-3, di-tert-butyl peroxide, tert-dicumyl peroxide, 2,5-dimethyl-2,5-di(tert-butylperoxy)hexane, dicumyl peroxide, α,α'-bis(tert-butylperoxyisopropyl)benzene, n-butyl-4,4-bis(tert-butylperoxy)butane, 2,2-bis(tert-butylperoxy)butane, 1,1-bis(tert-butylperoxy)cyclohexane, 1,1-bis(tert-butylperoxy)-3,3,5-trimethylcyclohexane, tert-butyl peroxybenzoate, and benzoyl peroxide. The loading of the organic peroxide is, for example, preferred to be 0.001 to 5 parts by mass per 100 parts by mass of the polymer according to the present invention.

When a solar cell encapsulant comprises a crosslinking agent, the crosslinking agent that has remained undecomposed during the assembling of a solar cell module may cause deterioration, such as discoloration, of the encapsulant through its gradual decomposition during the use of the solar cell module. In order to prevent the degradation of the encapsulant caused by a remaining crosslinking agent, the loading of the crosslinking agent to be added to the polymer according to the present invention is preferred to be as small as possible. In order to obtain a polymer having a high gel fraction even if the loading of the crosslinking agent is small, it is preferable to add an auxiliary crosslinking agent together with the crosslinking agent to the copolymer. Examples of the auxiliary crosslinking agent include monofunctional auxiliary crosslinking agents, bifunctional auxiliary crosslinking agents, trifunctional auxiliary crosslinking agents, and hexafunctional auxiliary crosslinking agents. Examples of the monofunctional auxiliary crosslinking agent include acrylates and methacrylates. Examples of the bifunctional auxiliary crosslinking agent include N,N'-m-phenylenebismaleimide. Examples of the trifunctional auxiliary crosslinking agent include triallyl isocyanurate and trimethylolpropane triacrylate. Examples of the hexafunctional auxiliary crosslinking agent include dipentaerythritol hexaacrylate. The auxiliary crosslinking agent is used, for example, in a proportion of 10 parts by mass or less per 100 parts by mass of the polymer according to the present invention.

A UV absorber may be added to the polymer according to the present invention in order to improve UV resistance. Examples of the UV absorber include benzophenone UV absorbers, benzotriazole UV absorbers, and hindered amine UV absorbers. Examples of the benzophenone UV absorbers include 2-hydroxy-4-octoxybenzophenone and 2-hydroxy-4-methoxy-5-sulfobenzophenone. Examples of the benzotriazole UV absorbers include 2-(2'-hydroxy-5-methylphenyl)benzotriazole. Examples of the hindered amine UV absorbers include phenyl salicylate and p-tert-butylphenyl salicylate.

An antioxidant may be added to the polymer according to the present invention in order to improve stability against oxidization. Examples of the antioxidant include amine antioxidants, phenol antioxidants, bisphenyl antioxidants, and hindered amine antioxidants, and specific examples include di-tert-butyl-p-cresol and bis(2,2,6,6-tetramethyl-4-piperazyl)sebacate.

(Forming)

The solar cell encapsulant comprising the polymer according to the present invention is processed into a sheet form (a sheet for a solar cell encapsulant), for example. The forming of a sheet for a solar cell encapsulant can be performed using a forming machine capable of sheet forming such as a T-die extruder and a calender.

In a more specific example of sheet forming, a mixture prepared by dry blending the above-described polymer with an organic peroxide (crosslinking agent) and, as necessary, additives such as a lightfast stabilizer beforehand is fed into an extruder through its hopper and then the mixture is extrusion-formed into a sheet format a shaping temperature at which the organic peroxide does not substantially decompose. In the extrusion forming, if the forming is performed via a taking-up roll with an embossed pattern, then an arbitrarily embossed patterned sheet for a solar cell encapsulant is obtained. An embossed sheet is preferred because it is resistant to blocking and air captured between the sheet and an adherend is removed easily during a process of forming a module of a solar cell.

The thickness of the sheet for a solar cell encapsulant is 0.1 mm to 1 mm, for example.

(Assembling of Solar Cell Module)

The light-receiving surface protective material in a solar cell module may be chosen appropriately from among glass, plastics, and other transparent materials. The lower protective material may be chosen appropriately from among various protective materials such as plastics, ceramics, stainless steel, and aluminum.

In one example of the assembling of a solar cell module, a plate-like solar cell element (a silicon substrate for a solar cell, etc.) is sandwiched on its both sides with two or more of the above-described sheets for a solar cell encapsulant. Subsequently, the resultant is brought into contact on one side with the above-described light-receiving surface protective material and on the other side with the above-described lower protective material, and after producing a vacuum condition, heating is performed at a temperature at which the sheet for a solar cell encapsulant melts. After melting the sheet for a solar cell encapsulant to some extent, the vacuum condition is released while keeping the heating condition and then pressure is applied. By the heating under the vacuum condition and the pressurized condition, the polymers according to the present invention contained in the same sheet for a solar cell encapsulant are crosslinked together and the polymers contained in two or more different sheets for a solar cell encapsulant sandwiching the solar cell element are crosslinked together. The above-described heating causes the silane coupling agent contained in the sheets for a solar cell encapsulant to react with the light-receiving surface protective material, the lower protective material, and the solar cell element, so that the sheets for a solar cell encapsulant are adhered to the light-receiving surface protective material or the lower protective material and the sheets for a solar cell encapsulant are adhered to the solar cell element.

In another example of the assembling of a solar cell module, the sheet for a solar cell encapsulant is prepared as an intermediate layer and the sheet for a solar cell encapsulant is sandwiched with the above-described light-receiving surface protective material and the above-described lower protective material. In this example, a plate-like solar cell element is sandwiched between the light-receiving surface protective material and the sheet for a solar cell encapsulant or between the lower protective material and the sheet for a solar cell encapsulant. Subsequently, a vacuum condition is produced and then heating is performed at a temperature at which the sheet for a solar cell encapsulant melts. After melting the sheet for a solar cell encapsulant to some extent, the vacuum condition is released while keeping the heating condition and then pressure is applied. By the heating under the vacuum condition and the pressurized condition, the polymers according to the present invention contained in the sheet for a solar cell encapsulant are crosslinked together. The above-described heating causes the silane coupling agent contained in the sheets for a solar cell encapsulant to react with the light-receiving surface protective material, the lower protective material, and the solar cell element, so that the sheet for a solar cell encapsulant is adhered to the light-receiving surface protective material, the lower protective material, and the solar cell element.

In any of the examples of assembling, at least one of the adhering surface of the sheet for a solar cell encapsulant, the adhering surface of the light-receiving surface protective material, and the adhering surface of the lower protective material has preferably been applied with primer treatment using a silane coupling agent or the like in order to improve adhesion between the sheet for a solar cell encapsulant and the light-receiving surface protective material or the lower protective material.

EXAMPLES

The present invention is described concretely below with reference to Examples and Comparative Examples.

(Procedures of Measurement and Evaluation of Physical Properties)

Physical properties in Examples and Comparative Examples were measured by the following methods.

(1) the Ratio (Unit: %) of the Number of the Repeating Units Represented by Formula (2) to the Total Number of the Carbon Atoms Constituting the Polymer Main Chain A $^1$H-NMR spectrum of a solution prepared by dissolving a polymer in ortho-dichlorobenzene was measured with a nuclear magnetic resonance apparatus. The polymers of Examples and Comparative Examples are each a polymer wherein $R^1$ of formula (2) is hydrogen and $R^2$ is an acetoxy group.

Using the resulting $^1$H-NMR spectrum, the ratio of the number of the repeating units represented by formula (2) to the total number of the carbon atoms constituting the polymer main chain was calculated from the following formula (6).

$$Y=100\times 2\alpha/(2\alpha+\beta-\gamma\times\alpha) \qquad (6)$$

In formula (6), Y is the ratio of the number of the repeating units represented by formula (2) wherein $R^1$ is hydrogen and $R^2$ is an acetoxy group to the total number of the carbon atoms constituting the main chain of the polymer.

$\alpha$ is the area of a peak derived from the hydrogen that is $R^1$ in formula (2). This peak is observed near 4.9 ppm in a $^1$H-NMR spectrum of a polymer.

$\beta$ is the sum total of the areas of all the peaks observed near 0.7 to 2.5 ppm in a $^1$H-NMR spectrum of a polymer. Specifically, $\beta$ is the sum total of the area of the peak derived from the hydrogen contained in formula (1) and the area of the peak derived from the hydrogen contained in the acetoxy group, which is $R^2$ of formula (2).

$\gamma$ is the number of the hydrogen contained in the acetoxy group, which is $R^2$ of formula (2). Since $R^2$ is an acetoxy group, $\gamma$ is 3.

(2) Ratio X (Unit: %)

A $^{13}$C-NMR spectrum of a solution prepared by dissolving a polymer in 1,1,2,2-tetrachloroethane d2 was measured with a nuclear magnetic resonance apparatus under the following conditions.

<Measurement Conditions>

Instrument: AVANCE600 manufactured by Bruker
Measurement probe: 10-mm cryoprobe
Measurement solvent: 1,1,2,2-tetrachloroethane d2
Measurement temperature: 130° C.
Measurement method: proton decoupling method
Pulse width: 45 degrees
Pulse repetition time: 4 seconds
Measurement standard: 1,1,2,2-tetrachloroethane d2 (74.2 ppm)
Transients: 256

Ratio X (%) was calculated from the following formula (3) using the $^{13}$C-NMR spectrum produced.

$$X=100\times A/(A+B) \qquad (3)$$

wherein A represents the total number of the carbon atoms of the carbonyl groups of the $R^2$s of all the repeating units that satisfy the following requirement (a2-1) and are represented by formula (2), (a2-1): no functional group represented by the following formula (A), (B), (C), (D), (E) or (F) is bonded to any of the carbon atoms $C^1$, $C^2$, and $C^3$, where $C^1$ is a carbon atom that bonds to a repeating unit represented by formula (2), $C^2$ is a carbon atom that bonds to $C^1$, and $C^3$ that bonds to $C^2$, and B is the total number of the carbon atoms of the carbonyl groups of the $R^2$s of all the repeating units represented by formula (2).

A in formula (3) is the area of a peak observed at 170.4 ppm. B is the area of a peak observed at 170.2 ppm.

(3) the Ratio (Unit: %) of the Number of the Carbon Atoms of the Repeating Units Represented by Formula (4) to the Total Number of the Carbon Atoms Constituting the Polymer Main Chain Using the $^{13}$C-NMR spectrum of the polymer used for calculating X, the ratio of the number of the carbon atoms of the repeating units represented by formula (4) to the total number of the carbon atoms constituting the polymer main chain was calculated from the following formula (10).

$$Z=100\times F/\{D-(E-1)\times C\} \qquad (10)$$

In formula (10), Z is the ratio of the number of the carbon atoms of the repeating units represented by formula (4) to the total number of the carbon atoms constituting the main chain of the polymer.

C is the area of a peak derived from the carbon atom of the carbonyl group of $R^2$ of formula (2) observed at between 168 ppm to about 180 ppm in a $^{13}$C-NMR spectrum of the polymer.

D is the sum total of the areas of all the peaks different from the peak derived from 1,1,2,2-tetrachloroethane d2 (the peak observed at 74.2 ppm) in a $^{13}$C-NMR spectrum of the polymer.

E is the number of the carbon atoms contained in formula (2).

F is the area of a peak derived from the carbon atom of formula (4) observed at between 120 ppm to about 140 ppm in a $^{13}$C-NMR spectrum of the polymer.

(4) Melting Point (Unit: ° C.)

A polymer was pressed with a pressure of 10 MPa for 5 minutes with a hot presser at 150° C., then cooled for 5 minutes with a cooling presser at 30° C., thereby being shaped into a sheet of about 100 μm in thickness. Subsequently, about 10 mg of sample was cut from the sheet and sealed in an aluminum pan. Then, the aluminum pan with the sample sealed therein was (1) held at 150° C. for 5 minutes, (2) cooled from 150° C. to 0° C. at a rate of 5° C./minute, (3) held at 20° C. for 2 minutes, (4) heated from 20° C. to 150° C. at a rate of 5° C./minute by using a differential scanning calorimeter (a differential scanning calorimeter DSC-7 manufactured by PerkinElmer Inc.), and a melting curve produced during (4) was measured. From the melting curve, the temperature at the top of the melting peak greatest in peak height among the melting peaks observed between 5° C. and the melting completion temperature (that is, the temperature at which the melting curve returns to its base line on the higher temperature side) was determined and this was taken as a melting point.

(5) Weight Average Molecular Weight (Mw, Unit: g/Mol), Number Average Molecular Weight (Mn, Unit: g/Mol), Molecular Weight Distribution (Mw/Mn, Unitless)

The weight average molecular weight (Mw) of a polymer was determined by multiplying the polystyrene-equivalent weight average molecular weight measured by gel permeation chromatography (GPC) by the Q factor ratio of polyethylene to polystyrene (17.7/41.3). The number average molecular weight (Mn) of a polymer was determined by multiplying the polystyrene-equivalent number average molecular weight as measured by gel permeation chromatography (GPC) by the Q factor ratio of polyethylene to polystyrene (17.7/41.3). Mw/Mn is the value calculated by dividing Mw by Mn. The measurement conditions used in GPC were as follows.
(1) Instrument: Waters150C, manufactured by Waters
(2) Separation column: TOSOH TSKgel GMH-HT
(3) Measurement temperature: 140° C.
(4) Carrier: ortho-dichlorobenzene
(5) Flow rate: 1.0 mL/min
(6) Injection amount: 500 μL
(7) Sample concentration: 5 mg/5 ml-ortho-dichlorobenzene
(8) Detector: differential refraction
(6) Gel Fraction (Unit: % by Mass)

About 1 g of crosslinked sheet was used as a sample. The sample was put in a basket made of 100-mesh wire gauze so that the sample might not leak out. The weight of the basket containing the sample was measured. The basket containing the sample was immersed in 100-ml xylene solvent and then heated for 8 hours while refluxing the xylene solvent. Subsequently, the basket containing the sample was raised from the xylene and then dried. The weight of the basket containing the dried sample was measured. From the weight measured before the heating and the weight measured after the drying was calculated the mass fraction of the components that failed to dissolve in xylene (the mass of the crosslinked sheet used was taken as 100% by mass).
(7) Weathering Test 1 (Acetoxy Group Survival Ratio, Unit: %)

The weather resistance of an uncrosslinked sheet was evaluated on the basis of the ratio of the number of the acetoxy groups contained in the sheet after light irradiation to the number of the acetoxy groups contained in the sheet before the light irradiation (hereinafter sometimes described as "acetoxy group survival ratio"). Specifically, the measurement was conducted as follows.

Two uncrosslinked sheets were put into a Daipla Metal Weather (manufactured by Dipla Wintes Co., Ltd.) and then were irradiated with light with a metal halide lamp (irradiation intensity: 145 mW/cm$^2$ at 295 nm to 430 nm, atmosphere: black panel temperature=63° C./humidity=50% RH). Light irradiation was applied for 48 hours for one sheet and light irradiation was applied for 96 hours for the other sheet.

The content of acetoxy groups was calculated by the following method. An infrared absorption spectrum of an uncrosslinked sheet before light irradiation and that of the uncrosslinked sheet after the light irradiation were measured, and the absorbance of a characteristic absorption of a carbonyl group (C=O) that appeared at or around 3460 cm$^{-1}$ was corrected with the thickness of the sheet and the content of acetoxy groups of each of the uncrosslinked sheets was determined using a calibration curve. The content of acetoxy groups of the sheet after the light irradiation determined when the content of acetoxy groups of the sheet before the light irradiation was taken as 100% was defined as an acetoxy group survival ratio. The larger the acetoxy group survival ratio, the better the weather resistance.
(8) Weathering Test 2 (Survival Ratio of Strength at Break, Survival Ratio of Elongation at Break, Unit: %)

The weather resistance of a crosslinked sheet was evaluated on the basis of the ratio of the strength at break of a sheet after light irradiation to the strength at break of the sheet before the light irradiation (hereinafter sometimes described as "survival ratio of strength at break") and the ratio of the elongation at break of a sheet after light irradiation to the elongation at break of the sheet before the light irradiation (hereinafter sometimes described as "survival ratio of elongation at break"). Specifically, the measurement was conducted as follows.

Two crosslinked sheets were put into a Daipla Metal Weather (manufactured by Dipla Wintes Co., Ltd.) and then were irradiated with light with a metal halide lamp (irradiation intensity: 145 mW/cm$^2$ at 295 nm to 430 nm, atmosphere: black panel temperature=63° C./humidity=50% RH). Light irradiation was applied for 48 hours for one sheet and light irradiation was applied for 96 hours for the other sheet.

A tensile test of a sheet before light irradiation and the sheet after the light irradiation was performed under the following conditions. Specimens were taken from each of the sheets using a No. 6 dumbbell-shaped form. Elongation at break and strength at break were measured by pulling the specimens at a chuck span of 65 mm and a tensile rate of 500 mm/minute according to JIS K 6251 with a tensile tester (STA-1225, manufactured by ORIENTEC Co., Ltd.) under an atmosphere of 23° C. and 50% RH. The strength at break of a sheet after light irradiation where the strength at break of the sheet before the light irradiation was taken as 100% was defined as strength at break survival ratio, and the elongation at break of a sheet after light irradiation where the elongation at break of the sheet before the light irradiation was taken as 100% was defined as elongation at break survival ratio. The larger the strength at break survival ratio or the elongation at break survival ratio, the better the weather resistance.
(9) Light Transmittance of Polymer (Unit: %)

A polymer was pressed with a pressure of 10 MPa for 5 minutes with a hot presser at 150° C., then cooled for 5 minutes with a cooling presser at 30° C., thereby being shaped into a sheet of about 500 μm in thickness. The light transmittances within a wavelength range of 400 nm to 1200 nm were measured from a light transmission spectrum of the sheet in its thickness direction with a spectrophotometer (UV-3150, manufactured by Shimadzu Corporation), and the average thereof was calculated.

Example 1

Production of 5-acetoxy-1-cyclooctene

Under an argon flow, 1,5-cyclooctadiene (1131 g, 10.455 mol, produced by Tokyo Chemical Industry Co., Ltd.) was fed into a 60-liter flask and cooled to 11° C., and then a solution of metachloroperbenzoic acid (1859 g, 65% purity, 6.97 mol) in chloroform (20 liters, produced by Wako Pure Chemical Industries, Ltd.) was dropped over about 2 hours at a temperature of 20° C. or lower. The mixture within the flask was stirred at room temperature for about 15 hours.

After the completion of the reaction, the reaction liquid was filtered. The filtrate was washed with 10% aqueous NaHSO$_3$ solution (10 liters, twice), saturated aqueous NaHCO$_3$ solution (10 liters), and saturated aqueous NaCl solution (10 liters). The washed organic layer was concentrated under reduced pressure.

The resulting crude product was purified by silica gel column chromatography (hexane/ethyl acetate=10/1, silica gel N60, produce by Kanto Chemical Co., Inc.), affording colorless, oily 1,2-epoxy-5-cyclooctene.

Under an argon flow, 1,2-epoxy-5-cyclooctene (730 g, 5.87 mol) and THF (9 liters) were fed into a 20-liter flask and cooled to 5° C. Subsequently, LiAlH$_4$ (111 g, 2.94 mol, produced by Wako Pure Chemical Industries, Ltd.) was added over about 2 hours, and then the mixture within the flask was stirred at 26° C. for 2 days.

After the completion of the reaction, the flask was cooled with ice water, followed by slow addition of water (500 ml), and then the mixture within the flask was filtered. The filtrate was concentrated under reduced pressure, and then the resulting crude product was purified by silica gel chromatography (hexane/ethyl acetate=3/1, silica gel N60, produced by Kanto Chemical Co., Inc.), affording colorless, oily 5-hydroxy-1-cyclooctene.

Under an argon flow, 5-hydroxy-1-cyclooctene (720 g, 5.55 mol) and pyridine (8.2 liters) were fed into a 20-liter flask and cooled to 2° C. Subsequently, acetyl chloride (988 g, 12.20 mol) was dropped over one hour, and the mixture within the flask was stirred at room temperature for one hour. After the completion of the reaction, the reaction product was diluted with diethyl ether (5 liters), water (3 liters) was added, and then the mixture within the flask was partitioned. The water layer was extracted with diethyl ether (10 liters, twice), and the entire organic layer was washed with 1N aqueous hydrochloric acid solution (5 liters), saturated aqueous $NaHCO_3$ solution (10 liters), and saturated aqueous NaCl solution (10 liters). The washed organic layer was dehydrated (with $MgSO_4$) and filtered, and the filtrate was concentrated under a reduced pressure. The resulting crude product was purified by silica gel column chromatography (hexane/ethyl acetate=20/1, Silica Gel N60, produced by Kanto Chemical Co., Inc.) and then distilled under reduced pressure (63 to 65° C., 0.4 kPa), affording colorless, oily 5-acetoxy-1-cyclooctene (758 g, 80%).

<Production of Polymer (1)>

Benzylidene-bis(tricyclohexylphosphine)dichlororuthenium (complex, 154 mg, produced by Aldrich) weighed under a nitrogen atmosphere was put into a 500 ml glass eggplant flask, which was then sealed with a three way stopcock. Nitrogen-bubbled ortho-dichlorobenzene (solvent, 64 ml), cyclooctene (monomer, 5.9 ml, produced by Tokyo Chemical Industry Co., Ltd.) and 5-acetoxy-1-cyclooctene (monomer, 5.0 ml) were dropped into the eggplant flask while rotating a stir bar within the eggplant flask. Then, the eggplant flask was put into an oil bath set at a reaction temperature (60° C.) and ring-opening metathesis polymerization was performed for 2 hours. Subsequently, the polymerization solution was dropped into methanol to perform reprecipitation, affording polymer (1'). The ratio of the number of the carbon atoms in the repeating units represented by formula (4) to the total number of the carbon atoms constituting the main chain of the polymer (1') was 11.2%.

The polymer (1') obtained via the reprecipitation was vacuum dried at 80° C. for 2 hours and then dissolved in ortho-dichlorobenzene (solvent, 80 ml). p-Toluenesulfonylhydrazide was dissolved in the solution and a reaction was carried out at 130° C. for 3 hours to hydrogenate the polymer (1'), affording polymer (1). The results of evaluation of the resulting polymer (1) are shown in Table 1.

<Production of Uncrosslinked Sheet (1)>

The resulting polymer (1) was pressed with a pressure of 2 MPa for 5 minutes with a hot presser at 90° C., then cooled for 5 minutes with a cooling presser at 30° C., thereby preparing an uncrosslinked sheet (1) of about 500 µm in thickness. The results of evaluation of uncrosslinked sheet (1) are shown in Table 2.

Example 2

Production of Polymer (2)

Benzylidene-bis(tricyclohexylphosphine)dichlororuthenium (complex, 175 mg) weighed under a nitrogen atmosphere was put into a 500 ml glass eggplant flask, which was then sealed with a three way stopcock. Nitrogen-bubbled ortho-dichlorobenzene (solvent, 62 ml), cyclooctene (monomer, 6.1 ml) and 5-acetoxy-1-cyclooctene (monomer, 7.1 ml) were dropped into the eggplant flask while rotating a stir bar within the eggplant flask. Then, the same treatment as Example 1 was performed, affording polymer (2). The results of evaluation of the resulting polymer (2) are shown in Table 1.

<Preparation of Crosslinked Sheet (2)>

One hundred parts by weight of polymer (2) was impregnated with 0.4 parts by weight of tert-butylperoxy-2-ethylhexyl carbonate (PERBUTYL E, produced by NOF Corporation, one-hour half-life temperature: 121° C.; an organic peroxide as a crosslinking agent) and 0.9 parts by mass of triallyl isocyanurate (TAIC, produced by Tokyo Chemical Industry Co., Ltd.; auxiliary crosslinking agent). Three hundred parts by weight toluene was added to the polymer (2) impregnated with the organic peroxide and the auxiliary crosslinking agent, and the polymer (2) was dissolved homogeneously in the toluene at 80° C. The solution was stirred for 5 minutes, affording a mixture. Then, the mixture was vacuum dried at 40° C. for 4 hours, affording polymer composition (2). Subsequently, in order to perform a crosslinking reaction and sheet forming, the above polymer composition (2) was pressed with a pressure of 10 MPa for 5 minutes with a hot presser at 90° C., then pressed with a pressure of 10 MPa for 20 minutes with a hot presser at 150° C., and then cooled for 5 minutes with a cooling presser at 30° C., thereby preparing a crosslinked sheet (2) of about 300 µm in thickness. The results of evaluation of crosslinked sheet (2) are shown in Table 3.

Example 3

Production of 5-methoxycarbonyl-1-cyclooctene

A 1-liter autoclave was charged with tert-butanol (144 g, 1.94 mol), $PdCl_2$ (2.9 g, 0.016 mol), $PPh_3$ (21.0 g, 0.08 mol), 1,5-cyclooctadiene (336 g, 3.11 mol, Tokyo Chemical Industry Co., Ltd.), and toluene (184 ml), and CO replacement was performed three times. Then, the contents were allowed to react at 90 to 92° C. for 4 days under CO pressurization (40 MPa). During this operation, CO pressurization (adjusted to 40 MPa) was performed every 24 hours.

After the completion of the reaction, the reaction liquid was filtered and the resulting filtrate was concentrated under reduced pressure, and then the residue was purified by silica gel chromatography (hexane/ethyl acetate=10/1 and then 5/1, Silica Gel N60, Kanto Chemical Co., Inc.), affording colorless oily 5-(tert-butoxy)-1-cyclooctene.

5-(tert-butoxy)-1-cyclooctene (216 g, 1.03 mol) and trifluoroacetic acid (450 ml) were charged into a 2-liter flask and then stirred at room temperature for 2 days. After the completion of the reaction, the reaction liquid was poured into a water (450 ml)-ethanol (1800 ml) mixed liquid and the resulting liquid was adjusted to pH4 with saturated sodium bicarbonate water. The resulting mixed liquid was extracted with diethyl ether (5 liters×5 times) and the extract was concentrated under reduced pressure.

The resulting residue was purified by silica gel chromatography (hexane/ethyl acetate=3/1, Silica Gel N60, Kanto Chemical Co., Inc.), affording white crystalline 5-methoxy-carbonyl-1-cyclooctene.

<Production of Polymer (7)>

Benzylidene-bis(tricyclohexylphosphine)dichlororuthenium (complex, 314 mg) weighed under a nitrogen atmosphere was put into a 500 ml glass eggplant flask, which was then sealed with a three way stopcock. Nitrogen-bubbled ortho-dichlorobenzene (solvent, 120 ml), cyclooctene (monomer, 11.0 ml) and 5-methoxycarbonyl-1-cyclooctene (monomer, 12.8 ml) were dropped into the eggplant flask while rotating a stir bar within the eggplant flask. Then, the same treatment as Example 1 was performed, affording polymer (7). The results of evaluation of the resulting polymer (7) are shown in Table 4.

<Preparation of Crosslinked Sheet>

One hundred parts by weight of polymer (7) was impregnated with 1.0 part by weight (crosslinking condition 1) or 2.0 parts by weight (crosslinking condition 2) of tert-butylperoxy-2-ethylhexyl carbonate (PERBUTYL E, produced by NOF Corporation, one-hour half-life temperature: 121° C.; an organic peroxide as a crosslinking agent) and 0.5 parts by mass of γ-methacryloxypropyltrimethoxysilane (A-174, produced by Momentive Performance Materials, Inc.; silane coupling agent). The polymer (7) impregnated with the organic peroxide and the auxiliary crosslinking agent was pressed with a pressure of 10 MPa for 5 minutes with a hot presser at 90° C., then pressed with a pressure of 10 MPa for 20 minutes with a hot presser at 150° C., and then cooled for 5 minutes with a cooling presser at 30° C., thereby preparing a crosslinked sheet of about 500 μm in thickness. The results of evaluation of the crosslinked sheet are shown in Table 4.

Comparative Example 1

Ethylene-Vinyl Acetate Copolymer (3)

Measurement of physical properties and preparation and evaluation of an uncrosslinked sheet were carried out in the same way as Example 1 except that a commercially available ethylene-vinyl acetate copolymer (K2010, produced by Sumitomo Chemical Co., Ltd.) was used as a polymer. The results of evaluation are shown in Tables 1 and 2.

Comparative Example 2

Ethylene-Vinyl Acetate Copolymer (4)

Measurement of physical properties and preparation and evaluation of a crosslinked sheet were carried out in the same way as Example 2 except that a commercially available ethylene-vinyl acetate copolymer (KA-40, produced by Sumitomo Chemical Co., Ltd.) was used as a polymer. The results of evaluation are shown in Tables 1 and 3.

Comparative Example 3

Polymer (5)

Production of Polymer (5)

Benzylidene-bis(tricyclohexylphosphine)dichlororuthenium (complex, 202 mg) weighed under a nitrogen atmosphere was put into a 500 ml glass eggplant flask, which was then sealed with a three way stopcock. Nitrogen-bubbled ortho-dichlorobenzene (solvent, 61 ml), cyclooctene (monomer, 9.8 ml) and 5-acetoxy-1-cyclooctene (monomer, 4.3 ml) were dropped into the eggplant flask while rotating a stir bar within the eggplant flask. Then, the same treatment as Example 1 was performed, affording polymer (5). The results of evaluation of the resulting polymer (5) are shown in Table 1.

Comparative Example 4

Polymer (6)

Production of Polymer (6)

Benzylidene-bis(tricyclohexylphosphine)dichlororuthenium (complex, 124 mg) weighed under a nitrogen atmosphere was put into a 500 ml glass eggplant flask, which was then sealed with a three way stopcock. Nitrogen-bubbled ortho-dichlorobenzene (solvent, 71 ml) and 5-acetoxy-1-cyclooctene (monomer, 11 ml) were dropped into the eggplant flask while rotating a stir bar within the eggplant flask. Then, the same treatment as Example 1 was performed, affording polymer (5). The results of evaluation of the resulting polymer (5) are shown in Table 1.

Comparative Example 5

Ethylene-Methyl Acrylate Copolymer (7)

Measurement of physical properties and preparation and evaluation of an uncrosslinked sheet were carried out in the same way as Example 3 except that a commercially available ethylene-methyl acrylate copolymer pellet (CG4002, produced by Sumitomo Chemical Co., Ltd.) was used as a polymer. The results of evaluation are shown in Table 4.

TABLE 1

|  |  | Example | | Comparative Example | | | |
|---|---|---|---|---|---|---|---|
|  |  | 1 | 2 | 1 | 2 | 3 | 4 |
| Resin |  | Polymer (1) | Polymer (2) | Ethylene-vinyl acetate copolymer (3) | Ethylene-vinyl acetate copolymer (4) | Polymer (5) | Polymer (6) |
| The ratio of the number of the repeating units represented by formula (2) to the total number of the carbon atoms constituting the polymer main chain | % | 4.4 | 5.4 | 4.7 | 5.6 | 2.4 | 10.2 |
| X | % | 100 | 100 | 80 | 77 | 100 | 100 |
| The ratio of the number of the repeating units represented by formula (4) to the total number of the carbon atoms constituting the polymer main chain | % | 0 | 0 | — | — | 0 | 0 |

TABLE 1-continued

|  |  | Example | | Comparative Example | | | |
|---|---|---|---|---|---|---|---|
|  |  | 1 | 2 | 1 | 2 | 3 | 4 |
| Melting point | ° C. | 65.8 | 60.0 | 76.9 | 66.6 | 89.0 | There were no peaks at 5° C. or higher. |
| Number average molecular weight (Mn) | g/mol | 40200 | 33800 | 22700 | 17400 | 40000 | 44800 |
| Weight average molecular weight (Mw) | g/mol | 86300 | 59300 | 85300 | 63900 | 65300 | 70300 |
| Mw/Mn | — | 2.2 | 1.8 | 3.7 | 3.7 | 1.6 | 1.6 |
| Light transmittance | % | 87 | 89 | 92 | 92 | — | — |

TABLE 2

|  |  | Example 1 | Comparative Example 1 |
|---|---|---|---|
| Survival ratio of acetoxy group (After 48-hour light irradiation) | % | 98.5 | 98.0 |
| Survival ratio of acetoxy group (After 96-hour light irradiation) | % | 97.3 | 96.7 |

TABLE 3

|  |  | Example 2 | Comparative Example 2 |
|---|---|---|---|
| Survival ratio of strength at break (After 48-hour light irradiation) | % | 33 | 28 |
| Survival ratio of strength at break (After 96-hour light irradiation) | % | 9 | 8 |
| Survival ratio of elongation at break (After 48-hour light irradiation) | % | 85 | 71 |
| Survival ratio of elongation at break (After 96-hour light irradiation) | % | 31 | 11 |
| Gel fraction | % by mass | 54 | 58 |

TABLE 4

|  |  | Example 3 | Comparative Example 5 |
|---|---|---|---|
| Resin |  | Polymer (7) | Polymer (8) |
| The ratio of the number of the repeating units represented by formula (2) to the total number of the carbon atoms constituting the polymer main chain X | % | 4.8 | 3.9 |
|  | % | 100 | 69 |
| The ratio of the number of the repeating units represented by formula (4) to the total number of the carbon atoms constituting the polymer main chain | mol % | 0 | — |
| Melting point | ° C. | 49.5 | 67.7 |
| Number average molecular weight (Mn) | g/mol | 41100 | 27300 |
| Weight average molecular weight (Mw) | g/mol | 79700 | 89900 |
| Mw/Mn | — | 1.9 | 3.3 |
| Gel fraction: Condition 1 | % | 81 | 63 |
| Gel fraction: Condition 2 | % | 87 | 81 |

INDUSTRIAL APPLICABILITY

The use of the polymer of the present invention makes it possible to produce a solar cell encapsulant excellent in weather resistance. The polymer of the present invention can be used suitably for the field of solar cell encapsulants.

The invention claimed is:

1. A polymer that has a main chain comprising repeating units represented by formula (1) and repeating units represented by formula (2) and satisfies requirements (a1), (a2), and (a3),

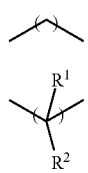

(1)

(2)

wherein $R^1$ represents hydrogen, a methyl group, or an ethyl group, and $R^2$ represents an acetoxy group, a methoxycarbonyl group, an ethoxycarbonyl group, or a tert-butoxycarbonyl group;

(a1): the ratio of the number of the repeating units represented by formula (2) to the total number of the carbon atoms that constitute the main chain of the polymer is from 4.0% to 7.5%;

(a2): the ratio X represented by formula (3) is from 82% to 100%;

$$X = 100 \times A/B \quad (3)$$

where
A represents the total number of the carbon atoms of the carbonyl groups of the $R^2$s of all the repeating units that satisfy the following requirement (a2-1) and are represented by formula (2), (a2-1): no functional group represented by the following formula (A), (B), (C), (D), (E) or (F) is bonded to any of the carbon atoms $C^1$, $C^2$, and $C^3$, where $C^1$ is a carbon atom that bonds to a repeating unit represented by formula (2), $C^2$ is a carbon atom that bonds to $C^1$, and $C^3$ that bonds to $C^2$,

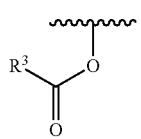

(A)

-continued

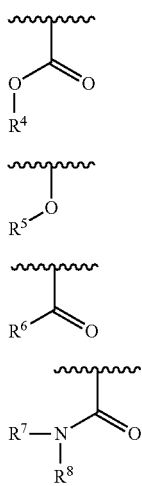

(B)

(C)

(D)

(E)

wherein $R^3$, $R^4$, $R^5$, $R^6$, $R^7$, and $R^8$ each independently represent an alkyl group or hydrogen; and B is the total number of the carbon atoms of the carbonyl groups of the $R^2$s of all the repeating units represented by formula (2); and (a3): the polymer has a melting point of 42° C. to 90° C. as measured with a differential scanning calorimeter.

2. The polymer according to claim 1, wherein the main chain further comprises repeating units represented by formula (4),

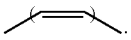 (4)

3. The polymer according to claim 1, wherein the polymer has a gel fraction of 40% by mass or more where the mass of the polymer is taken as 100% by mass.

4. A solar cell encapsulant comprising the polymer according to claim 1.

5. The polymer according to claim 2, wherein the polymer has a gel fraction of 40% by mass or more where the mass of the polymer is taken as 100% by mass.

6. A solar cell encapsulant comprising the polymer according to claim 2.

7. A solar cell encapsulant comprising the polymer according to claim 3.

* * * * *